United States Patent [19]

Lucas et al.

[11] Patent Number: 5,699,260

[45] Date of Patent: Dec. 16, 1997

[54] TECHNIQUE FOR OPTIMIZING THE NUMBER OF IC CHIPS OBTAINABLE FROM A WAFER

[75] Inventors: David Lucas, Malmesbury, United Kingdom; Mark Foy; Fergal Loughran, both of Limerick, Ireland

[73] Assignee: Analog Devices, Incorporated, Norwood, Mass.

[21] Appl. No.: 403,621

[22] Filed: Mar. 14, 1995

[51] Int. Cl.$^6$ .................................................. G06F 19/00
[52] U.S. Cl. ............... 364/468.28; 355/53; 364/167.01; 364/491
[58] Field of Search .................... 364/491, 488, 364/489, 490, 468.28, 559, 167.01, 468.21; 355/53, 77

[56] References Cited

U.S. PATENT DOCUMENTS

| | | | |
|---|---|---|---|
| 3,716,296 | 2/1973 | Springer et al. | 355/53 |
| 4,530,587 | 7/1985 | Kosugi et al. | 355/53 |
| 5,305,222 | 4/1994 | Nakamura | 364/468 |
| 5,448,333 | 9/1995 | Iwamoto et al. | 355/53 |
| 5,448,488 | 9/1995 | Oshima | 364/468 |

*Primary Examiner*—Joseph Ruggiero
*Attorney, Agent, or Firm*—Parmelee & Bollinger, LLP

[57] ABSTRACT

The yield of good die from wafers is optimized by positioning the first level mask with respect to the wafer in accordance with a calculated alignment relationship based on physical characteristics of the wafer and the size of the die to be formed in the wafer. The calculated alignment relationship establishes the offset between the wafer and the mask which will result in the maximum available die. This offset is calculated by a computer which examines a number of prospective offsets between the center of one of the die and the center of the wafer. The number of available die is calculated for each such offset, and the offset which maximizes the available die from the wafer is determined.

17 Claims, 6 Drawing Sheets

| | 0 | 0.466 | 0.932 | 1.398 | 1.864 | 2.33 | 2.796 | 3.262 | 3.728 | 4.194 |
|---|---|---|---|---|---|---|---|---|---|---|
| 0 | 285 | 285 | 287 | 287 | 284 | 286 | 284 | 287 | 287 | 285 |
| 0.443 | 285 | 284 | 285 | 286 | 285 | 284 | 285 | 286 | 285 | 284 |
| 0.886 | 283 | 282 | 283 | 286 | 287 | 284 | 287 | 286 | 283 | 282 |
| 1.329 | 283 | 282 | 284 | 285 | 284 | 284 | 284 | 285 | 284 | 282 |
| 1.772 | 281 | 281 | 281 | 281 | 283 | 284 | 283 | 281 | 281 | 281 |
| 2.215 | 289 | 290 | 288 | 288 | 290 | 289 | 290 | 288 | 288 | 290 |
| 2.658 | 287 | 286 | 286 | 285 | 287 | 288 | 288 | 286 | 287 | 287 |
| 3.101 | 287 | 285 | 287 | 288 | 287 | 288 | 287 | 288 | 287 | 285 |
| 3.544 | 285 | 284 | 286 | 288 | 289 | 286 | 289 | 288 | 286 | 284 |
| 3.987 | 285 | 285 | 286 | 287 | 287 | 286 | 287 | 287 | 286 | 285 |

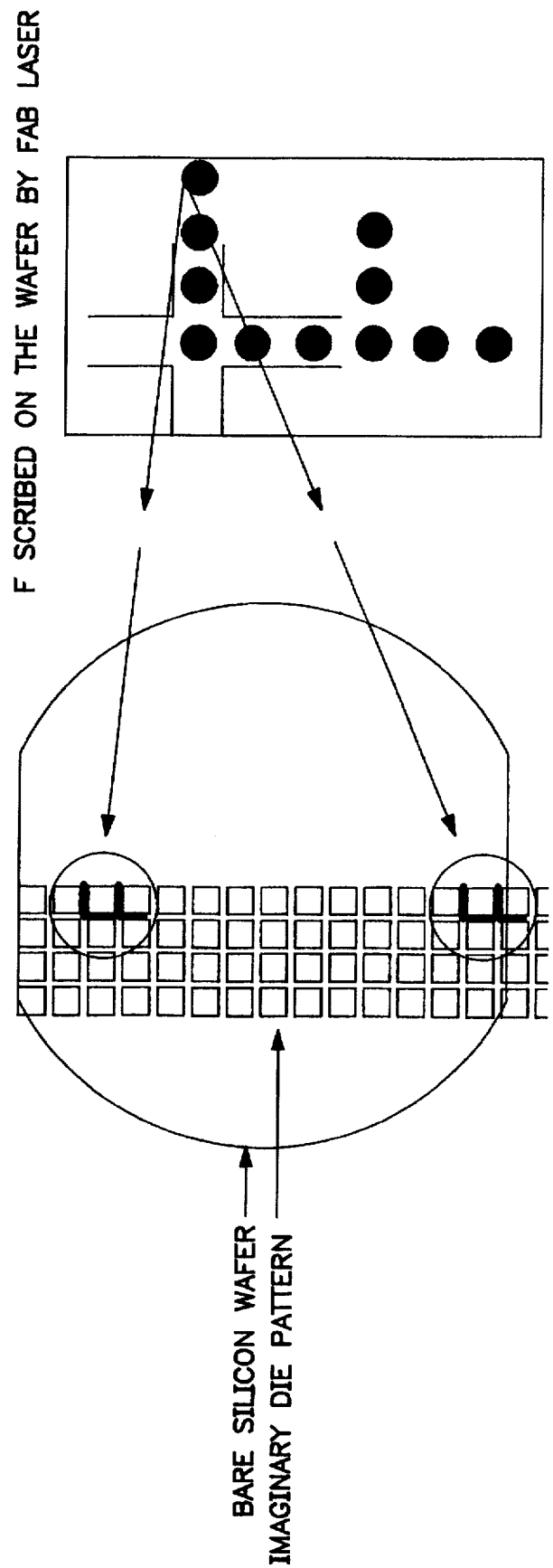

TECHNIQUE FOR OPTIMIZING THE NUMBER OF IC CHIPS OBTAINABLE FROM A WAFER

BACKGROUND OF THE INVENTION

1. Field of the Invention

This invention relates to the manufacture of integrated-circuit (IC) chips wherein relatively large wafers (e.g., 4 inches in diameter) are formed with a number of identical die which ultimately are separated into IC chips. More particularly, this invention relates to processing of wafers in a way to maximize the number of die obtained from each wafer.

2. Description of the Prior Art

In manufacturing IC chips, a silicon wafer typically is processed by projection-aligned-photolithography through a number of sequential stages to develop in the wafer successive layers establishing a group of closely-adjacent identical die. The finished wafer then is scribed to separate the die which are packaged as individual IC parts.

This photolithographic process employs a series of masks to create light patterns on the wafer establishing the circuit structure of the die. The wafer is primarily circular in configuration (with opposed flats for handling purposes) and the projected die outlines are rectangular. Thus, the curved outer edges of the wafer will necessarily be formed with a number of partial die, i.e., die which do not contain all of the required integrated circuitry and which therefore are incomplete and must be discarded. The positioning and structure of such incomplete die are determined by the relative alignment between the mask and the wafer.

In projection-aligned-photolithography, light is passed through the mask and onto the wafer. Each mask is a plate of glass covered with a layer of chrome with the required patterns etched out of the chrome. The wafer is coated with a light-sensitive material (photoresist) which hardens where the light passes through the mask, thereby transferring the mask pattern onto the wafer. The wafer is processed chemically to develop the pattern in the silicon material. The wafer will require many images of such patterns to be applied to the wafer surface in succession, followed each time by further processing, and thus the wafer will pass through the photolithographic treatment area a number of times. The position of the die with respect to the wafer is determined by the positioning of the first level mask only, since all subsequent masks are aligned to the first level mask position.

It has been the usual practice to randomly align the first level mask to the wafer. The relative positioning of the light pattern on the wafer establishes the number of complete die available from the wafer. Slight changes in the position of the mask with respect to the wafer can change the number of available die. With random positioning of the first mask, the available die from a number of wafers will be the average of the available die for all of the individual alignments, with some wafers having more available die than others.

SUMMARY OF THE INVENTION

It has been found possible to increase significantly the yield of good die from wafers by positioning the first level mask with respect to the wafer in accordance with a calculated alignment relationship based on physical characteristics of the wafer and the size of the die to be formed in the wafer. The calculated alignment relationship establishes the offset between the wafer and the mask which will result in the maximum available die. In one specific procedure employed for this purpose, a computer carried out a program which examines a number of prospective offsets between the center of one of the die and the center of the wafer. The number of available die is calculated for each such offset, and the offset which maximizes the available die from the wafer is determined.

In this particular procedure, the X and Y offsets of the scribe lane intersection for the die closest to the center of the wafer are determined. A known type of laser marker device then is used to mark a blank wafer at this scribe lane intersection. This marked wafer is called a template wafer. The first level mask is placed in the mask aligner (a conventional piece of equipment typically used in IC processing) and the mask is aligned with the mark on the template wafer. The template wafer is then replaced by a new blank wafer without disturbing the mask alignment, and an exposure is made on the blank wafer. Subsequent masking levels are then aligned to the existing exposed pattern on the wafer (i.e., by being aligned to the first level mask), and the wafer is further exposed and processed as in prior art techniques. The template wafer may subsequently be re-used to pre-align other wafer batches.

Other objects, aspects and advantages of the invention will in part be pointed out in, and in part apparent from, the following description of a preferred embodiment considered together with the accompanying drawings.

BRIEF DESCRIPTION OF THE DRAWINGS

FIGS. 4a and 4b show a laser-marked template wafer;

FIG. 5 illustrates dimensional relationships between the die-street intersections and the major flat of the wafer;

DESCRIPTION OF A PREFERRED EMBODIMENT

Figures 1, 3:
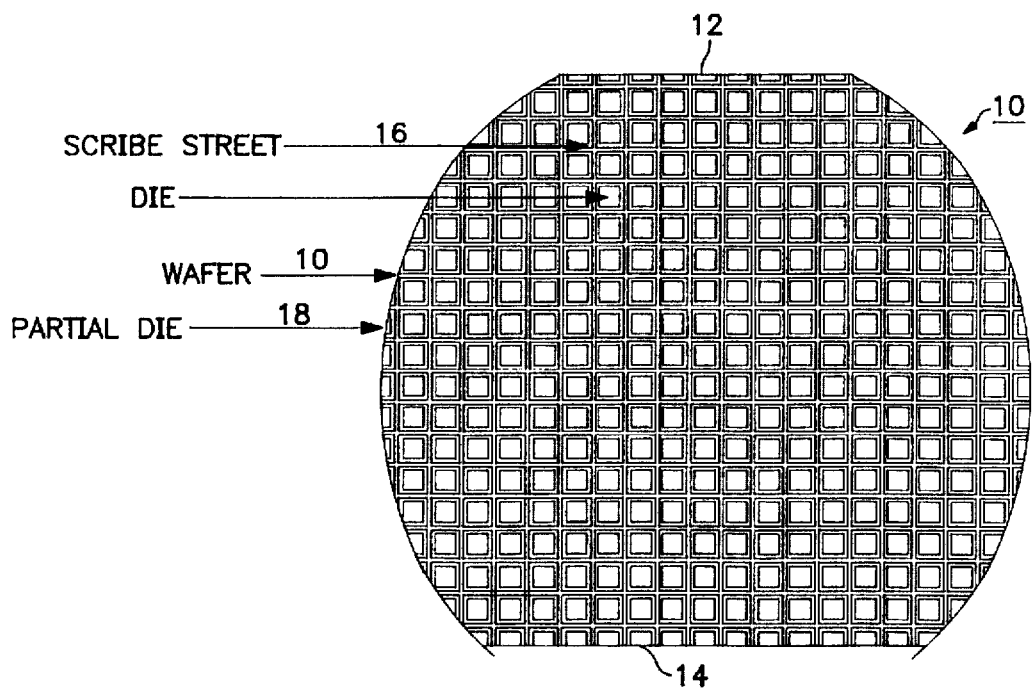
FIG. 1 is a pictorial illustration of a typical wafer, with a die pattern shown over the wafer surface.
FIG. 3 is a matrix illustrating the results of calculations of total die per wafer for different offsets.

Referring to FIG. 1, there is shown in outline a typical silicon wafer 10 from which IC chips are made. The upper and lower edges of the wafer are formed with parallel flats 12, 14 to accommodate handling by processing apparatus. The lower flat 14 is longer (and thus is referred to as the "major flat"). The shorter upper flat 12 is called the "minor flat".

A rectilinear die pattern is illustrated on the wafer, with the individual die being rectangular in shape. The lines 16 separating the rows and columns of die are called scribe streets (or lanes), and define lines along which the wafer ultimately will be broken apart, both horizontally and vertically, to separate the die for packaging as IC chips. The scribe streets are parallel (or perpendicular) to the flats 12, 14. At the edges of the wafer there will be a number of partial die 18, i.e., incomplete die which cannot become good IC chips.

Figure 2:
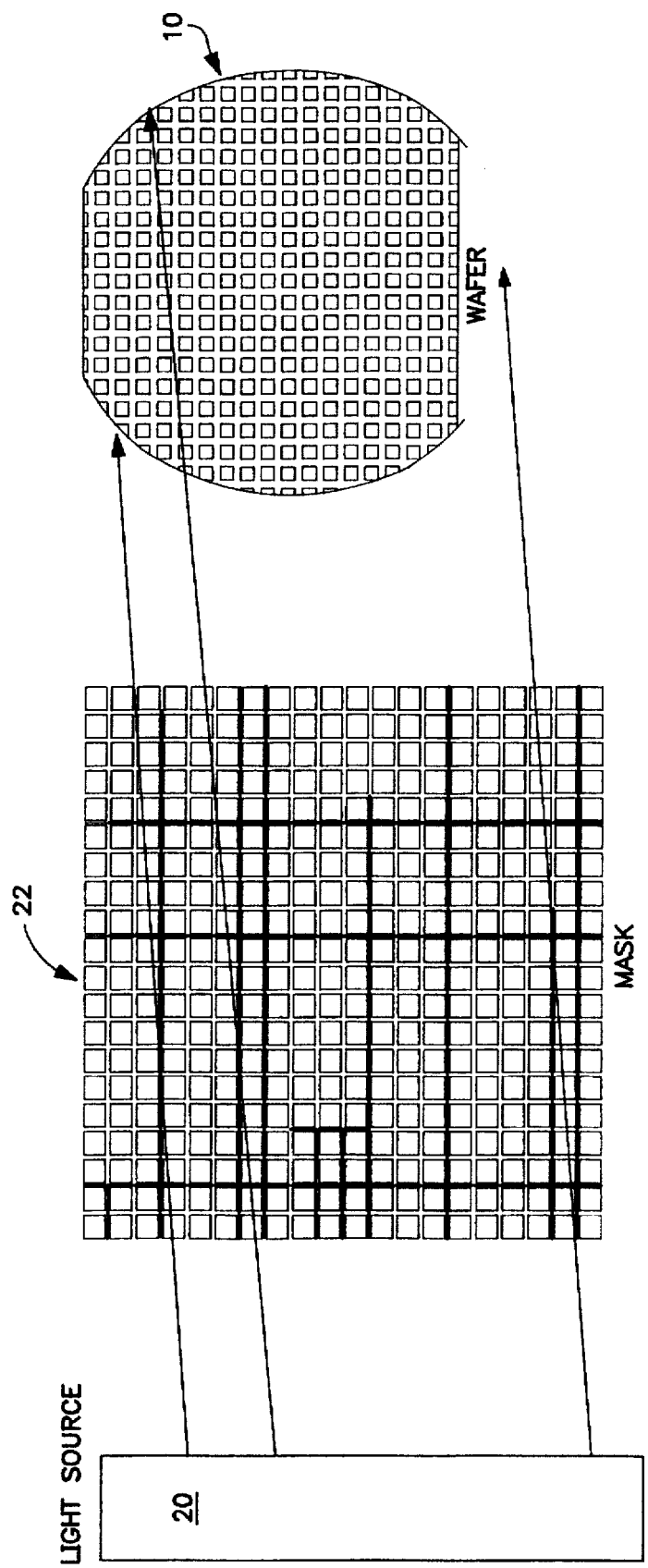
FIG. 2 is a diagrammatic presentation of projection-aligned-photolithography.

FIG. 2 illustrates pictorially the basic elements of the projection-alignment-photolithographic method wherein the wafer is exposed to various die patterns (in sequence) to establish the successive layers of the IC chips. This method includes a light source 20 which transmits light through a mask 22 having multiple identical die patterns which cast corresponding patterns on the wafer 10. The wafer is coated with light-sensitive material (photo-resist) which hardens at the regions struck by light. Subsequent chemical processing (etching, etc.) is employed to transform the patterned silicon surface to the required configuration. The first level mask (i.e., the initial mask used in the processing) establishes the alignment of all of the subsequent masks employed.

The technique employed in the preferred embodiment of the invention includes the steps of calculating the total die per wafer (TDPW) for a number of prospective offset positions of the mask 22 with respect to the wafer 10. The positions selected for such calculations are successive and closely spaced along orthogonal X and Y axes, where the X axis is parallel to the flats 12, 14 and the Y axis is perpendicular to the flats.

FIG. 3 shows the results of such a series of calculations, arranged in matrix form. This set of data is only for purposes of illustrating the technique, and is substantially simplified so that it does not represent an actual set of calculations which would be used for a real wafer. In any event, the calculations used to develop the data in FIG. 3 were for a die of dimensions 4.66 and 4.43 mm, to be patterned on a wafer of 50 mm radius with a bead around the circumference of 3 mm width, the major and minor flats at 3 mm and 1 mm and a text border of 4.724 mm. The X axis step size (between prospective positions for calculation purposes) was 0.466 mm, and the Y axis step size was 0.443, i.e., 0.1 times the die dimensions.

Figure 7:
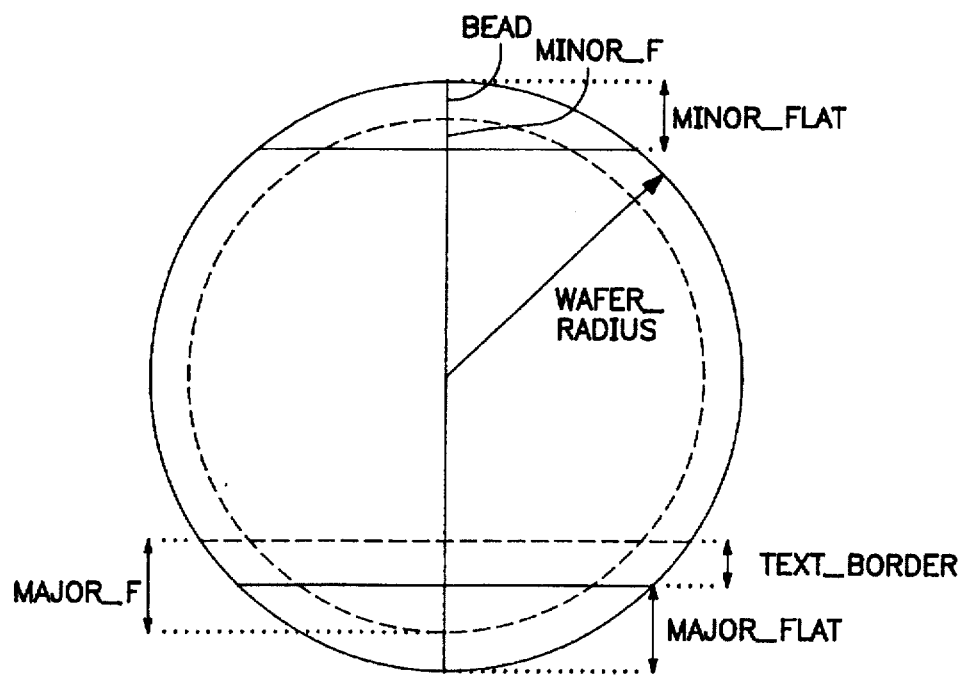
FIG. 7 is a diagram identifying relevant dimensions of a wafer.
Figure 8:
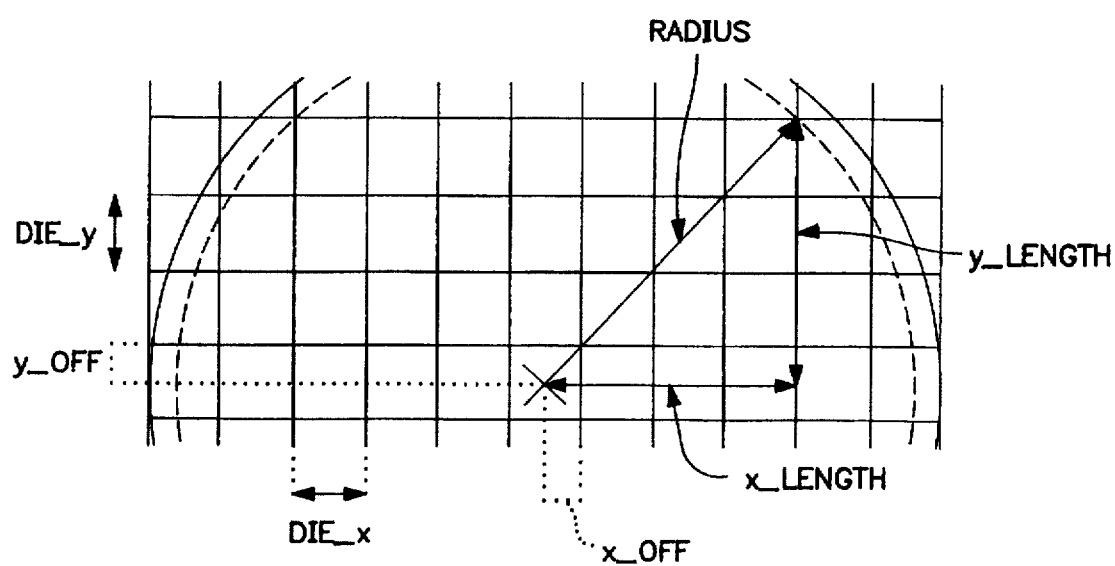
FIG. 8 is a diagram showing die/wafer alignment dimensions.

The calculations of the total die per wafer for each prospective position followed the method set forth in Appendix I and FIGS. 7 and 8.

The elements of the FIG. 3 matrix represent the total die per wafer for the offset positions identified by the matrix coordinates. For example, for the offset position of 0.466 on the X-axis and 0.443 on the Y axis, the calculated number of total die (TDPW) was 284. Examination of the entire matrix shows that the maximum die per wafer was 290, at four offset positions. The selected offset position for such a result would be one of these locations. The selected candidate location is that position which has the largest contiguous plateau of identical maximum die per wafer (the plateau being the locus of all Max TDPW positions, as might appear for example in a 3-dimensional display of the data).

In a practical realization of the technique, the calculations would be performed at a far greater number of prospective positions than in FIG. 3, i.e., the step size would be much smaller than used to develop that matrix. For example, the step size might by 5 μm (0.005 mm). This would produce a matrix array of 933×886 elements. This is much too large to be analyzed visually (as in FIG. 3). Thus, a computer preferably is used both to carry out the calculations and also to search the matrix for the plateau of the maximum TDPW (corresponding for example to an imaginary line between the offset positions represented by the Max TDPW of 290 shown in FIG. 3). The final answer developed by the computer would be the X and Y coordinates at the middle of this plateau, with respect to the center of the wafer.

A computer program called "align" is described in Appendix II for carrying out such calculations.

In order to achieve the Max TDPW calculated as described above, the mask 22 is aligned to the wafer rather than the wafer being aligned to the mask as in prior art techniques. The mask is aligned to the offset coordinates developed by the above-described calculations (see Appendices I and II). In the preferred technique, this mask alignment uses a template wafer which, in this case, has two letter F's inscribed on it. The letter F was chosen because it is the only character to have only one corner at the upper left-hand region of the character, a feature providing an advantage in carrying out the process. The two F's are scribed on the wafer with a known device called a laser marker, capable of scribing a character on a wafer at user defined coordinates.

To determine where the F's are to be located, the coordinates of the selected Max TDPW plateau position preferably are transformed into the coordinates of alternate sites which will give Max TDPW, i.e., sites which are an integer number of die dimensions from each other, as shown for the positions of the two F's in FIG. 4a. The two F's are marked as far from each other as possible on the Y-axis to effectively eliminate rotational error.

As shown in the expanded FIG. 4b portion of the drawing, the letter F is printed as a dot matrix character with the top left-hand dot in the intersection of two scribe streets. The location of this intersection is determined by the X and Y offset coordinates previously determined. In the preferred system used in carrying out this invention, the location of the center of the plateau of Max TDPW with respect to the center of the wafer was transformed to plateau coordinates with respect to the middle point of the major flat, with coordinate distances in this case in mils (thousandths of an inch) rather than millimeters, simply to suit the equipment available. However, the selection of a coordinate ground point and dimension scaling is basically a matter of convenience.

Figure 5:
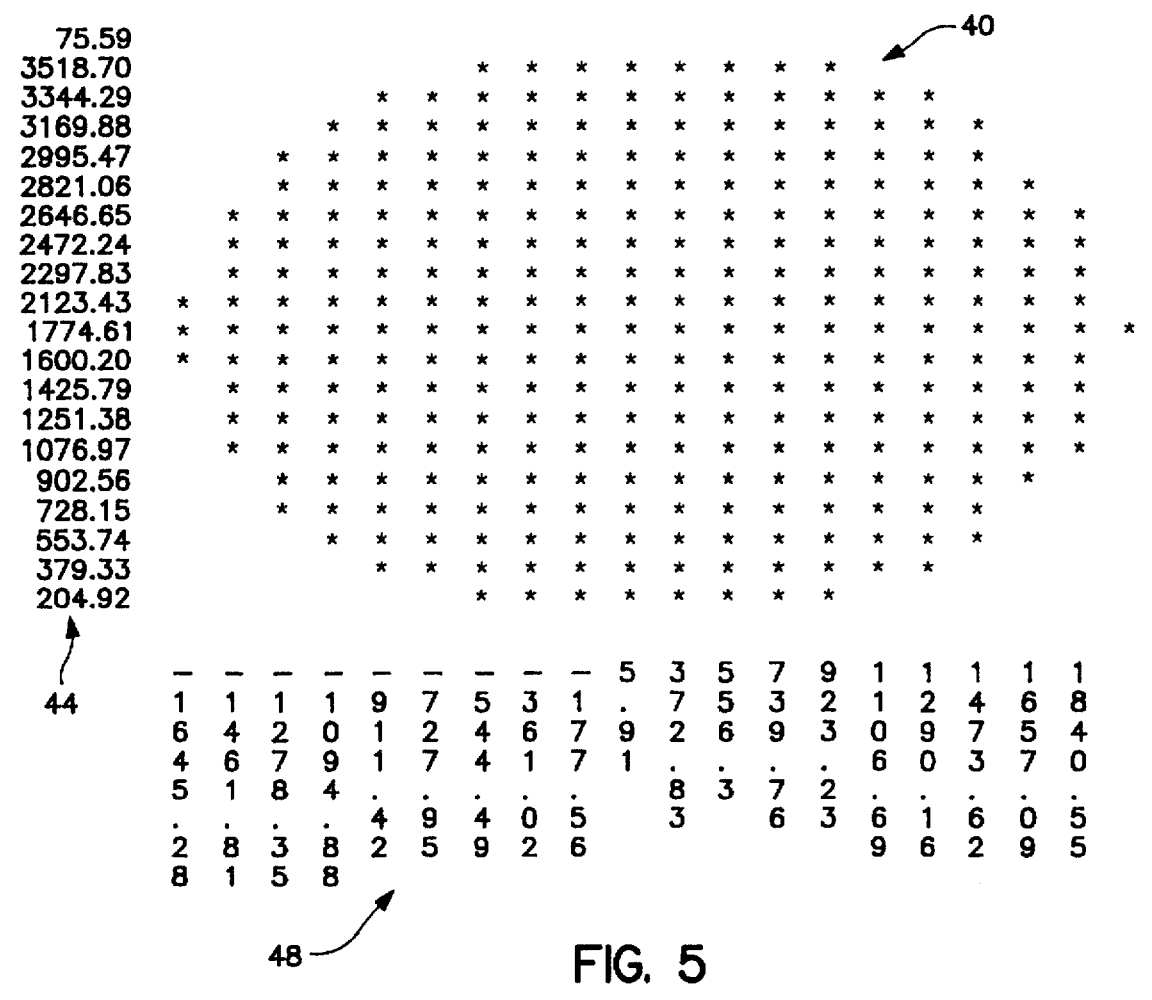

FIG. 5 shows a computer-generated map of the wafer wherein each star in the star set 40 represents the location of the street intersection of four die. Adjacent the stars are relevant data. One column of numbers 44 gives the Y-axis distance in mils that the die are above the major flat. The lower columns of numbers 48 show the X-axis distance in mils between the die and the middle of the major flat.

Figure 6:
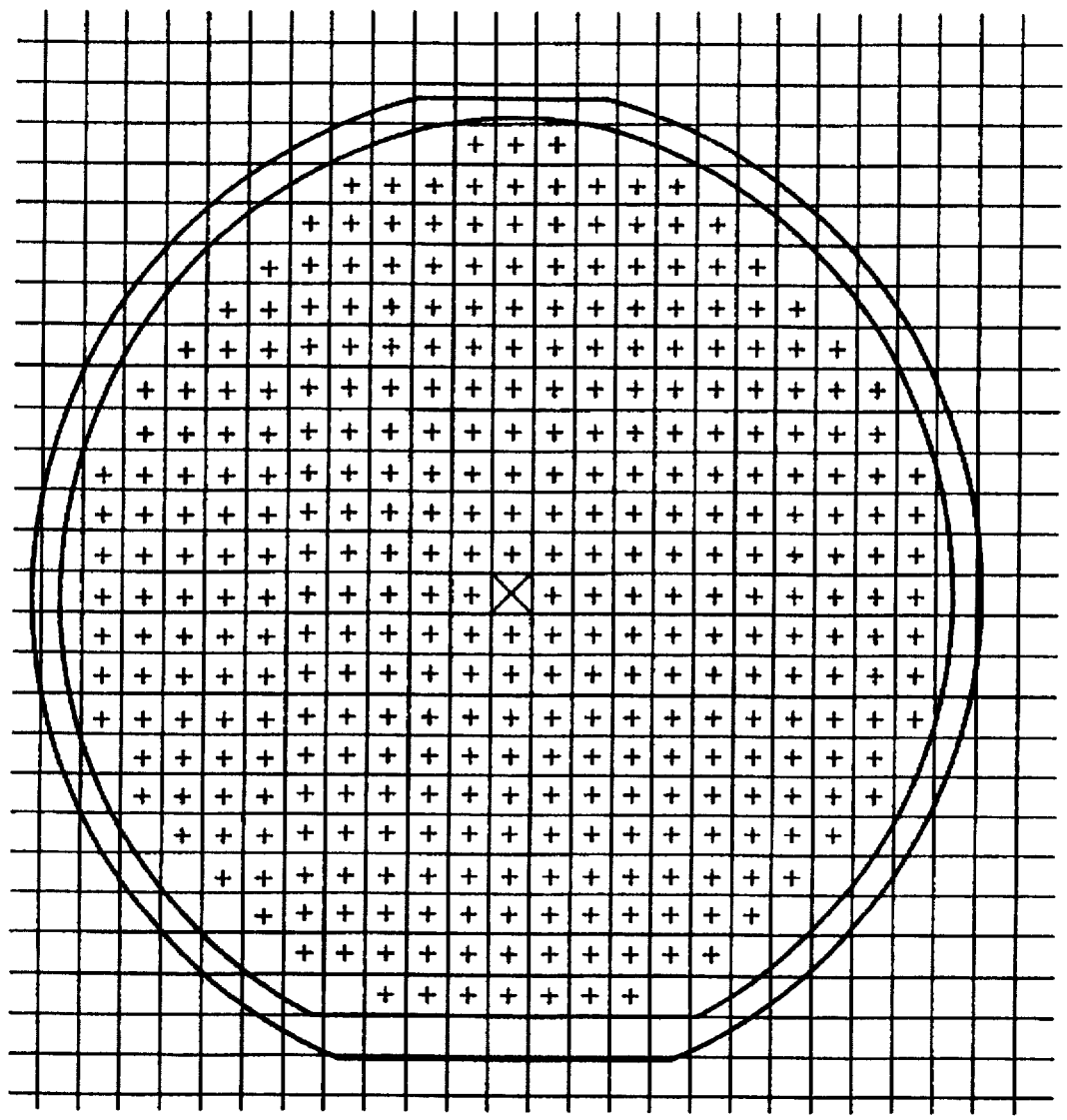
FIG. 6 shows diagramatically a technique for verifying the die pattern alignment.

The positioning of the F's on the template wafer may be verified by creating a life-sized drawing of the wafer with the correct position of the die pattern with respect to the wafer, as shown in FIG. 6. The drawing can be made by a computer using the available data such as:

| wafer radius (mm): | 50.000 | x step size (mm): | 4.660 |
|---|---|---|---|
| bead (mm): | 3.000 | y step size (mm): | 4.430 |
| major flat (mm): | 3.000 | x offset (mm): | 2.324 |
| minor flat (mm): | 1.000 | y offset (mm): | 2.102 |
| text border (mm): | 4.724 | | |
| | | total die: | 298 |

The drawing is transferred onto a transparency using a photocopier. The transparency is then placed on the F-wafer. The corners of the F's should coincide with the corner of the die on the transparency.

The marked template wafer cannot be used in a production environment, and therefore a production reference wafer is manufactured to replace the template. This reference wafer will be formed with a first level mask pattern aligned for Max TDPW. To manufacture such a reference wafer, the F wafer and the first layer mask are loaded into the aligner (conventional processing equipment). Using the viewing optics of the aligner, the mask is moved to align it to the two F's such that the top left-hand dots are seen in scribe street intersections. The mask now is in position to optimize the number of complete die from the wafer and from all subsequent wafers, since they are always positioned at exactly the same position. The F wafer then is replaced with a bare silicon wafer coated with photo-resist, and this wafer will become the production reference. This wafer is exposed and sent for normal first level processing.

When a batch of wafers is started, the production reference wafer and first level mask are loaded into the aligner. The mask is moved into alignment with the reference wafer. That wafer then is removed and the batch of wafers to be processed is loaded into the machine. As each wafer is loaded in exactly the same position, each wafer is aligned for Max TDPW.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

---

APPENDIX I

TOTAL DIE PER WAFER (TDPW) ALGORITHM

INPUTS

This algorithm uses wafer dimensions supplied by the wafer vendors together with an estimation of the "bead" size.

OUTPUT

The algorithm is used in the "align" program which calculates the optimum mask offset to achieve maximum available die.

Definition of Wafer Dimensions

These dimensions are displayed on FIG. 7

| | |
|---|---|
| wafer_radius: | Physical radius of wafer. Data supplied by wafer vendor |
| minor_flat: | Dimension of minor flat. Data supplied by wafer vendor |
| major_flat: | Dimension of major flat. Data supplied by wafer vendor |
| bead: | Dimension of unusable silicon around edge of wafer (estimated). |
| radius: | Radius of usable silicon to inner edge of bead. radius = wafer_radius − bead |
| text_border: | Height of text area above the major flat if (minor_flat > bead) minor_f = minor_flat − bead else minor_f = 0 |
| major_f: | Reduction in radius of usable silicon caused by major flat and text border if (major_flat + text_border > bead) major_f = major_flat + text_border − bead else major_f = 0 |

Definition of Die Dimension

These dimensions are displayed on FIG. 8

| | |
|---|---|
| die_x: | Stepping distance of die in x direction |
| die_y: | Stepping distance of die in Y direction |
| x_off: | Offset of die array from center of wafer in x direction |
| y_off: | Offset of die array from center of wafer in y direction |

Method

The method of calculation of total die per wafer divides the wafer into an upper and lower half of the wafer, and calculates the number of available die in each half.

| | |
|---|---|
| upper_rows: | No. of complete rows of the die array above the center, but not including the row containing the center point upper_rows = (int) ((radius − minor_f − y_off)/die_y) |
| lower_rows: | No. of complete rows of the die array below the center, but including the row containing the center point lower_rows = (int) ((radius − major − f + y_off)/die_y) |

Taking each upper row in turn − row = 1 to upper_rows calculate:

| | |
|---|---|
| y_length: | y distance from center of wafer to top of row y_length = row * die_y + y_off |
| x_length: | x distance from center of wafer to point where bead cuts top of row x_length = sqrt(radius * radius − y_length * y_length) |
| right_die: | no. of usable die to the right of the center line if (x_length < x_off) right_die = 0 else right_die = (int) ((x_length − x_off)/die_x) |
| left_die: | no. of usable die to the left of the center line left_die = (int) ((x_length + x_off)/die_x) |
| num_die: | no. of usable die on this row num_die = left_die + right_die |

Taking each lower row in turn − row = 1 to lower_rows calculate:

| | |
|---|---|
| y_length | y distance from center of wafer to bottom of row y_length = row*die_y − y_off |
| x_length: | x_distance from center of wafer to point where bead cust bottom of row x_length = sqrt(radius*radius − y_length*y_length) |
| right_die: | no. of usable die to the right of the center line if (x_length < x_off)right die = 0 else right_die =(int) ((xlength − x_off)/die_x) |
| left_die: | no. of usable die to the left of the center line left die + (int) ((x length_x_off/ die_x) |
| num_die: | no. of usable die on this row num die = left_die + right_die |

Result

The total number of usable die on the wafer is the sum of the totals for each row

---

APPENDIX II

THE "ALIGN" PROGRAM

Overview

The align program is used to compute the optimum positioning of the mask with respect to the wafer to maximize the die on the wafer.

The method calculates the total die per wafer for an initial alignment, then offsets the mask with respect to the wafer by small increments and recomputes the total die per wafer. The optimum offset is that position which generates the most die, but as there could be several locations which yield the maximum die, the location which shows the least sensitivity to changing the total die value for small changes in position is chosen.

Algorithm

1. Get the wafer and die dimensions from the user.
2. n_x = die_x/step_x
   n_y = die_y/step_y
   Where  n_x, n_y are the no. of offsets in x and y directions
   die_x, die_y are the die dimensions.
   step_x, step_y are the increments in offset in the x and y directions and are chosen as the re-positioning accuracy of the equipment.

-continued

3. Create an array A of size n_x by n-y. Each element of the array corresponds to a particular offset.
   For each of the n_x*n_y offsets calculate the total die per wafer and store in the corresponding position in array A.
4. Scan all elements of array A and record the maximum value as max_die.
5. Scan all elements of array A and record no. of occurrences N of the value max_die, and their positions.
6. If N is equal to 1, then the position in the array A having the value max_die corresponds to the optimum offset, the result is printed and the program terminates.
7. If N is greater than 1, then the optimum position has to be selected.
8. For each of the candidate positions, a figure of merit F is generated.
   F = Fpx + Fnx + Fpy + Fny
   Where  Fpx is the "spread" in the positive x direction.
          Fnx is the "spread" in the negative x direction.
          Fpy is the "spread" in the positive y direction.
          Fny is the "spread" in the negative y direction.
   and "spread" is defined as the distance along which the max_die is constant.
9. The optimum position is that which yields the highest figure of merit F. This result is printed and the program terminates.

What is claimed is:

1. In a projection-aligned-photolithgraphic process for making integrated-circuit (IC) chips wherein a wafer is subjected to a series of photolithographic procedures in which a plurality of masks including a first level mask are employed to project onto the wafer images of die patterns defining layers of a plurality of identical die which after formation are separated into corresponding IC parts; said die patterns presenting the die in rows and columns and covering the wafer in each exposure to avoid need for step-and-repeat alignment;

that procedure for optimizing the number die obtainable from a wafer which comprises:
   carrying out calculations which determine for given physical characteristics of the wafer the number of die of specified dimensions which can be produced from said wafer for each of a series of closely-spaced adjacent offset positions of said pattern with respect to said wafer;
   developing from said calculations the offset dimensions between the wafer and the projected images of die patterns which provide the maximum number of die from said wafer;
   forming a template wafer having at least one symbol the positioning of which is based on said calculated offsets; and
   utilizing said template wafer to align said first level mask.

2. The method of claim 1, wherein said rows and columns extend in orthogonal directions referred to herein as X and Y respectively;
   said closely-spaced adjacent offset positions being located along both said X and Y directions; and
   said calculations developing the X and Y offsets which provide the maximum number of complete die from the wafer.

3. The method of claim 2, wherein said positions are established as offsets of said pattern from a base location on said wafer.

4. The method of claim 3, wherein said wafer is of circular configuration and said base location is the center of the circular wafer.

5. The method of claim 3, wherein said wafer is circular and has opposed flats; said base location being established as a point on one of said flats.

6. The method of claim 5, wherein said base location is at the center of said one flat.

7. The method of claim 1, including the step of aligning the mask with the template wafer to fix the positioning of said mask relative to said template wafer for maximizing the number of die.

8. The method of claim 7, including the further steps of processing a wafer through a series of predetermined photolithographic procedures using masks aligned with said first-level mask to form a plurality of additional die layers developing finished IC chips in the wafer.

9. The method of claim 7, wherein said first-level mask is aligned to a production reference wafer prepared from said template wafer.

10. The method of claim 1, wherein the template wafer is formed with at least one character identifying the location of a die street intersection.

11. The method of claim 10, wherein there are two characters spaced apart on the wafer to minimize rotational error.

12. The method of claim 11, wherein the two characters are the letter "F", with its upper left-hand corner in each case positioned in a die street intersection.

13. The method of claim 10, including the step of forming said character with a laser marker.

14. In a projection-aligned-photolithgraphic process for making IC chips from a wafer, wherein patterns of identical die are applied to the wafer sequentially from a series of masks including a first level mask to establish successive layers making up the IC chips; each layer completely covering the wafer in a single exposure; and wherein the geometry of the die and the wafer result in formation of partial die along the wafer edge;

the method of maximizing the number of complete die which can be produced from the wafer comprising the steps of:
   calculating the number of complete die which will result for each of a series of alignment positions of the die pattern with respect to the surface of the wafer, said alignment positions being closely adjacent and extending in orthogonal directions away from an initial alignment position;
   determining the locus of alignment positions of said first level mask which result in the maximum total number of die per wafer; and
   selecting in accordance with predetermined criteria one of said determined alignment positions for said first level mask as that position to be maintained during the processing of the wafer into IC chips.

15. The method of claim 14, wherein said locus of alignment positions is a plateau; and
    said one position being selected at the middle of said plateau.

16. In a projection-aligned-photolithgraphic process for making IC chips from a wafer, wherein patterns of identical die are applied to the wafer by the use of sequential masks including a first level mask in order to form successive layers of the wafer which together establish IC chips to be separated for packaging;

the method of carrying out the process so as to maximize the available die from the wafer comprising the steps of:
   determining that alignment relationship between the first-level mask and the wafer which will maximize the available die;

adjusting the positioning of said first-level mask to said determined alignment relationship; and aligning all subsequent ones of said sequential masks to the alignment position of said first-level mask in carrying out the process of forming IC chips.

17. The method of claim 16, wherein a template wafer is produced to present the determined alignment between the die pattern and the wafer for producing maximum available die, said template wafer being marked to show the determined alignment relationship;

optically aligning the first-level mask with said template wafer;

utilizing said first-level mask in its optically-aligned position to produce a production reference wafer; and thereafter utilizing said production reference wafer to effect alignment of the sequence of masks employed to produce IC chips from wafers.

* * * * *